(12) United States Patent
Choi et al.

(10) Patent No.: US 9,829,513 B2
(45) Date of Patent: Nov. 28, 2017

(54) LINE VOLTAGE DETECTION CIRCUIT

(71) Applicant: Marvell World Trade LTD., St. Michael (BB)

(72) Inventors: Jinho Choi, Saratoga, CA (US); Hao Peng, Sunnyvale, CA (US); Wanfeng Zhang, Palo Alto, CA (US); Tuyen Doan, San Jose, CA (US)

(73) Assignee: MARVELL WORLD TRADE LTD., Hamilton (BM)

( * ) Notice: Subject to any disclaimer, the term of this patent is extended or adjusted under 35 U.S.C. 154(b) by 381 days.

(21) Appl. No.: 14/548,832

(22) Filed: Nov. 20, 2014

(65) Prior Publication Data
US 2015/0077090 A1     Mar. 19, 2015

Related U.S. Application Data

(63) Continuation of application No. 13/398,150, filed on Feb. 16, 2012, now Pat. No. 8,896,288.
(Continued)

(51) Int. Cl.
*G01R 19/00* (2006.01)
*H02M 3/335* (2006.01)
(Continued)

(52) U.S. Cl.
CPC ......... *G01R 19/0084* (2013.01); *G01R 17/02* (2013.01); *H02M 3/33523* (2013.01);
(Continued)

(58) Field of Classification Search
CPC ............... G01R 19/0084; G01R 17/02; H02M 3/33523; H02M 1/082; H02M 2001/0022; H05B 33/0854
(Continued)

(56) References Cited

U.S. PATENT DOCUMENTS 5,073,850 A * 12/1991 Pace ................... H02M 3/1563
                                                                  323/222
5,585,713 A    12/1996 Crane et al.
(Continued)

FOREIGN PATENT DOCUMENTS

JP    2002175896 A    6/2002
JP    2004273267 A    9/2004
(Continued)

OTHER PUBLICATIONS

Extended European Search Report dated Jul. 26, 2013 for Eurpoean Application No. 11742694.0.
(Continued)

*Primary Examiner* — Melissa Koval
*Assistant Examiner* — Courtney McDonnough

(57) ABSTRACT

A first filter outputs a first signal in response to receiving an input signal. The first signal has a first state in response to the input signal reaching a first threshold voltage on a leading edge of the input signal, and a second state in response to the input signal reaching the first threshold voltage on a trailing edge of the input signal. A second filter outputs a second signal in response to receiving the input signal. The second signal has the first state in response to the input signal reaching a second threshold voltage on the leading edge of the input signal, and the second state in response to the input signal reaching the second threshold voltage on the trailing edge of the input signal. A detection circuit determines, based on times when the first and second thresholds are reached, whether the input signal is received from a triac.

13 Claims, 6 Drawing Sheets

Related U.S. Application Data

(60) Provisional application No. 61/444,106, filed on Feb. 17, 2011.

(51) Int. Cl.
  *H05B 33/08* (2006.01)
  *G01R 17/02* (2006.01)
  *H02M 1/08* (2006.01)
  *H02M 1/00* (2006.01)

(52) U.S. Cl.
  CPC ......... *H05B 33/0854* (2013.01); *H02M 1/082* (2013.01); *H02M 2001/0022* (2013.01)

(58) Field of Classification Search
  USPC ...................................................... 324/76.11
  See application file for complete search history.

(56) References Cited

U.S. PATENT DOCUMENTS

| | | | |
|---|---|---|---|
| 5,907,539 A | | 5/1999 | Riley |
| 6,745,337 B1 * | | 6/2004 | Trivedi ............... G06F 13/4072 |
| | | | 713/400 |
| 6,831,426 B2 | | 12/2004 | Brevetti et al. |
| 7,019,469 B1 | | 3/2006 | Thurk et al. |
| 7,358,679 B2 | | 4/2008 | Lys et al. |
| 7,649,327 B2 | | 1/2010 | Peng |
| 8,222,832 B2 | | 7/2012 | Zheng et al. |
| 8,228,001 B2 | | 7/2012 | Fan |
| 8,441,210 B2 | | 5/2013 | Shteynberg et al. |
| 2005/0275354 A1 | | 12/2005 | Hausman et al. |
| 2007/0040516 A1 | | 2/2007 | Chen |
| 2009/0184662 A1 | | 7/2009 | Given et al. |
| 2009/0195168 A1 | | 8/2009 | Greenfeld |
| 2009/0261744 A1 | | 10/2009 | Chen et al. |
| 2009/0284233 A1 | | 11/2009 | Murdock et al. |
| 2010/0164406 A1 | | 7/2010 | Kost et al. |
| 2010/0213859 A1 | | 8/2010 | Shteynberg et al. |
| 2011/0012530 A1* | | 1/2011 | Zheng ................ H05B 33/0815 |
| | | | 315/294 |
| 2011/0043133 A1 | | 2/2011 | Van Laanen et al. |
| 2011/0175532 A1 | | 7/2011 | Peng |
| 2011/0194312 A1 | | 8/2011 | Gaknoki et al. |
| 2011/0199014 A1 | | 8/2011 | Pitigoi-Aron et al. |
| 2011/0254467 A1* | | 10/2011 | Chiang ............. H05B 33/0821 |
| | | | 315/297 |

FOREIGN PATENT DOCUMENTS

| | | |
|---|---|---|
| JP | 2007035403 A | 2/2007 |
| WO | WO-2010011971 A1 | 1/2010 |

OTHER PUBLICATIONS

International Searching Authority, "International Search Report" for Application No. PCT/US2011/024083; dated Mar. 30, 2011.

Rand, D., et al. "Issues Models and Solutions for Triac Modulated Phase Dimming of LED Lamps," Power Electronics Specialists Conference, 2007; PESC 2007, IEEE, IEEE Piacataway NJ, USA; Jun. 17, 2007; pp. 1398-1404.

International Search Report and Written Opinion for PCT Application No. PCT/US2012/025395 dated Jun. 19, 2012.

* cited by examiner

LINE VOLTAGE DETECTION CIRCUIT

CROSS-REFERENCE TO RELATED APPLICATIONS

The present disclosure is a continuation of U.S. application Ser. No. 13/398,150 (now U.S. Pat. No. 8,896,288), for "TRIAC Dimmer Detection" filed Feb. 16, 2012, which claims priority to U.S. Provisional App. No. 61/444,106 for "TRIAC Dimming Detection Method and Control Algorithm" filed Feb. 17, 2011. The entire disclosures of the applications referenced above are incorporated herein by reference.

BACKGROUND

Particular embodiments generally relate to methods, apparatus, and algorithms for detecting the presence or use of a bidirectional triode thyristor, commonly known in the industry as a triode for alternating current (TRIAC) device, for controlling light emitting diodes (LED).

Unless otherwise indicated herein, the approaches described in this section are not prior art to the claims in this application and are not admitted to be prior art by inclusion in this section.

Many industrial and commercial applications use various types of light sources for illuminating, indicating, or backlighting different types of stationary and mobile display devices, such as large scale advertising display boards and residential lighting, all the way down to small cellular telephone displays. In such applications, many designers and manufacturers are using light emitting diodes (LEDs) because LEDs have many performance and cost advantages over other available light source technologies. Such advantages include greater reliability, lower power consumption, lower maintenance requirements, and lower costs, and have contributed to a significant increase in the use of LEDs in many industries.

This upward trend in using LEDs for lighting applications have been further bolstered by various advances in LED design and manufacturing that have led to even longer usable life, greater energy savings, better quality light, higher safety, smaller and more versatile packages, and greater durability. All of these advantages have contributed to the increased use of LEDs in residential and commercial lighting applications. However, to fully replace legacy dimmable light sources, such as incandescent light sources, LEDs often require the use of retrofits of dimmers and other control circuitry for controlling the light output level of the LEDs.

Many dimmers currently implemented and installed are based on bidirectional triode thyristors or bilateral triode thyristors, commonly known in the industry as a triode for alternating current (TRIAC) devices. Such TRIACs can conduct current in either direction when triggered, or otherwise turned-on, and are commonly used in many low power applications, such as light dimmers, speed controls for electric motors, and in many other household appliances.

One prevalent uses of TRIACs is in dimmers for incandescent lamps. FIG. 1 shows a simplified schematic of a conventional TRIAC based dimmer for use in various lighting applications. The particular example of the TRIAC based dimmer 100 shown in FIG. 1 can be used to manually set the light output level of a light source to customize the light level or energy consumption. The TRIAC 110 can be coupled to an alternating current (AC) source 105 and a bridge diode 115. The AC source 105 can operate at various frequencies and voltages ranges. Typically the frequency and voltage ranges are standard and set by government or other regulating bodies. For example, in North America, household power is supplied at 50-60 Hz with voltages in the range or 110-130V. Bridge diode 115 can be coupled to a light source, such as lamp 120 of an appropriate rating based on the light requirements and the specifications of the AC source 105.

To change the output level of the lamp 120, the TRIAC 110 can be used to chop the current on the leading or trailing edge of the AC source 105, as shown in FIG. 2. Leading edge dimmers, such as TRIAC dimmers, essentially remove, or chop, some portion of the AC current 220 by only conducting the input current 230 when the input voltage reaches a certain threshold level 210A on the leading edge of the current signal, as shown in graph 200A. In contrast, trailing edge dimmers chop some portion of the AC current 220 by only conducting the input current 230 until the input voltage reaches a certain threshold level 210B on the trailing edge of the current, as shown in graph 200B. Such augmented input signals are thus referred to as being "chopped" because there are periods in the rising or falling edge of the input signal in which the signal is cut-off. The cut-off portions of the input signal represent the periods when the dimmer is non-conducting. As the chopped AC current 220 is integrated overtime, less current is delivered to a lamp than would be if the input current 230 was delivered to the lamp, and therefore the lamp appears less bright.

In similar implementations, a TRIAC based dimmer can be biased or controlled with a radio frequency (RF) signal to provide some portion of the rising edge input AC current to produce an output AC current 300 with a profile like the one shown in FIG. 3. During the RF bias conduction periods 315A and 315B, the input signal is conducted by the TRIAC to deliver the rising edge portions 310A and 310B of the input current, as shown. Accordingly, the AC current can be chopped at various times during the rising edge to produce specific AC current profiles to a component, light source or lamp.

Unfortunately, the use of TRIAC dimmers is not particularly compatible with many of the retrofit LED modules coming onto the market in anticipation of the phase of incandescent light bulbs and lamps. Most conventional legacy TRIAC dimmers expect to see some resistive load, such as an incandescent lamp, however, most LED circuits present a capacitive and inductive load to the legacy TRIAC dimmer, rendering them mostly incompatible. Embodiments of the present disclosure are directed toward systems, apparatus and methods for detecting the use and effects of a TRIAC based dimmer so that it can be effectively used to dim and control a LED light source.

SUMMARY

Embodiments of the present disclosure include a line voltage detection circuit, and systems that include the circuit. Such embodiments can include a first digital filter module configured to output a first high signal when an input signal reaches a first threshold voltage on a leading edge of the input signal. The digital filter module can be further configured to output a first low signal when the input signal reaches the first threshold voltage on a trailing edge of the input signal. The line voltage detection circuit also includes a second digital filter module configured to output a second high signal when the input signal reaches a second threshold voltage on the leading edge of the input signal and configured to output a second low signal when the input signal reaches the second threshold voltage on the trailing edge of the input signal. Such a line voltage detection circuit can also include a third digital filter module configured to output a third high signal when the input signal reaches a third threshold voltage on the leading edge of the input signal and configured to output a third low signal when the input signal reaches the third threshold voltage on the trailing edge of the input signal.

According to some embodiments, the third threshold voltage can be greater than the second threshold voltage. In related embodiments, the second threshold voltage can be greater than the first threshold voltage.

In other embodiments, the first digital filter module, the second digital filter module, and the third digital filter module of the line voltage detection circuit can each include a digital filter circuit, a flip-flop circuit having an output coupled to an input of the digital filter circuit, a first comparator having an output coupled to a first input of the flip-flop circuit, and a second comparator having an output coupled to a second input of the flip-flop circuit.

Other embodiments of the present disclosure are directed toward methods of detecting a chopped input signal. Such method includes setting a first and second threshold voltages and a time threshold. Once the thresholds are set, the method includes receiving an input signal and then generating a first high digital output signal when the input signal reaches the first threshold voltage on a leading edge of the input signal, and generating a second high digital output signal when the input signal reaches the second threshold voltage on the leading edge of the input signal.

In yet other embodiments, include generating a first low digital output signal when the input signal reaches the first threshold voltage on a trailing edge of the input signal, and generating a second low digital output signal when the input signal reaches the second threshold voltage on the trailing edge of the input signal. Such methods can also include determining a first time when the first high digital output signal begins and determining a second time when the second high digital output signal begins, then determining a difference between the first time and the second time, and comparing the difference between the first time and the second time with the time threshold.

Various other embodiments include determining a third time when the first high digital output signal ends and determining a fourth time when the second high digital output signal ends, determining a difference between the third time and the fourth time, and comparing the difference between the third time and the fourth time with the time threshold. In related embodiments, the method can also include determining a type of input signal in response to the comparison between the difference between the first time and the second time, and the time threshold. The type of input signal can be determined to be a leading edge chopped signal when the difference between the first time and the second time is less than or equal to the time threshold.

The following detailed description and accompanying drawings provide a more detailed understanding of the nature and advantages of the present invention.

DESCRIPTION

Described herein are techniques for systems, methods and apparatuses for detecting the use of a TRIAC dimmer so that the TRIAC dimmer can be used with an LED light source in a variety of operating conditions. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
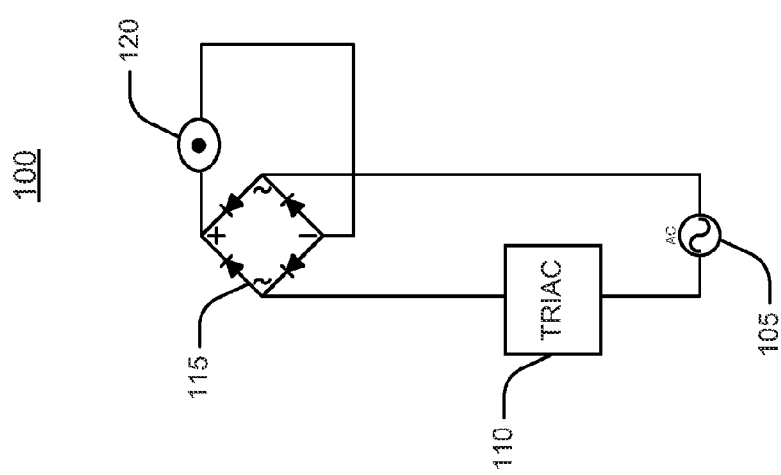
FIG. 1 shows a simplified schematic of a conventional TRIAC based dimmer and lamp.
Figure 2:
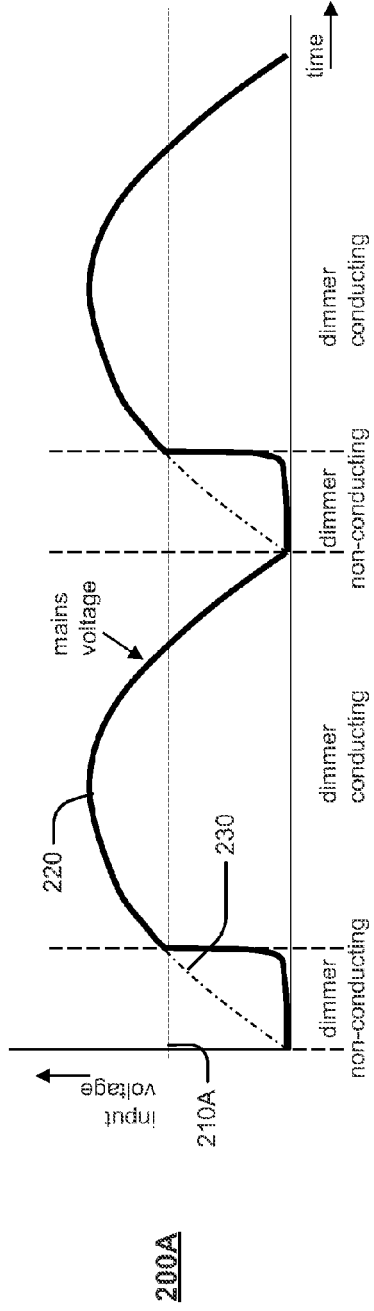
FIG. 2 illustrates the chopped output AC current resulting from the use of TRIAC based dimmer.
Figure 2:
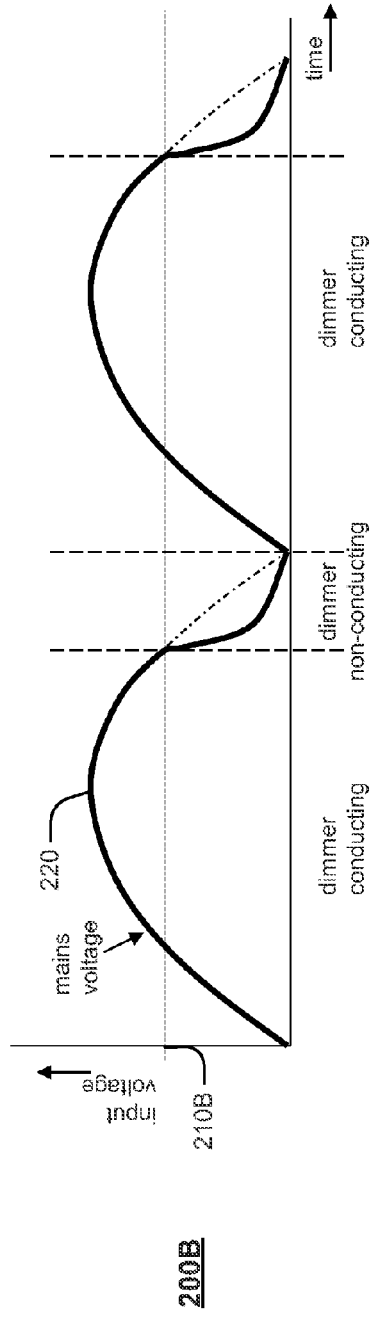
Figure 3:
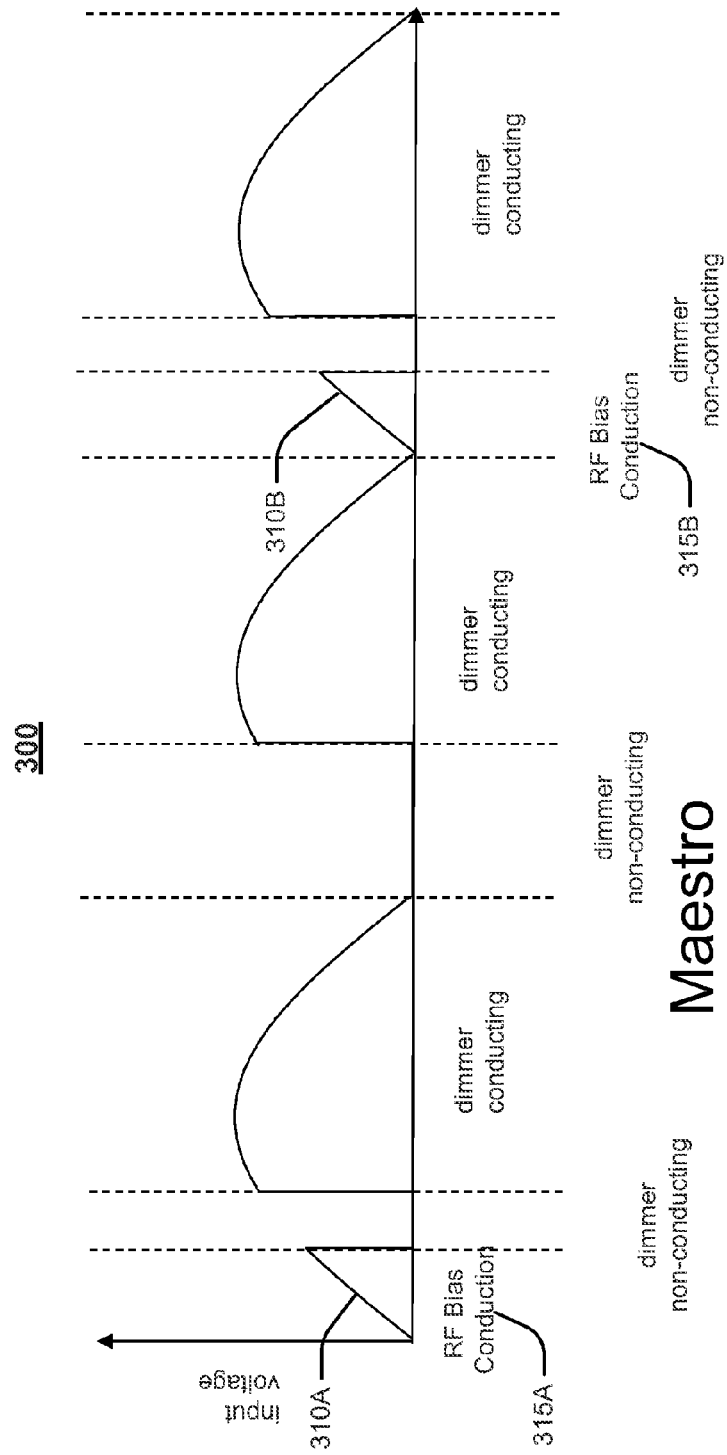
FIG. 3 illustrates the chopped output AC current resulting from the use of radio frequency (RF) biased TRIAC based dimmer.
Figure 4:
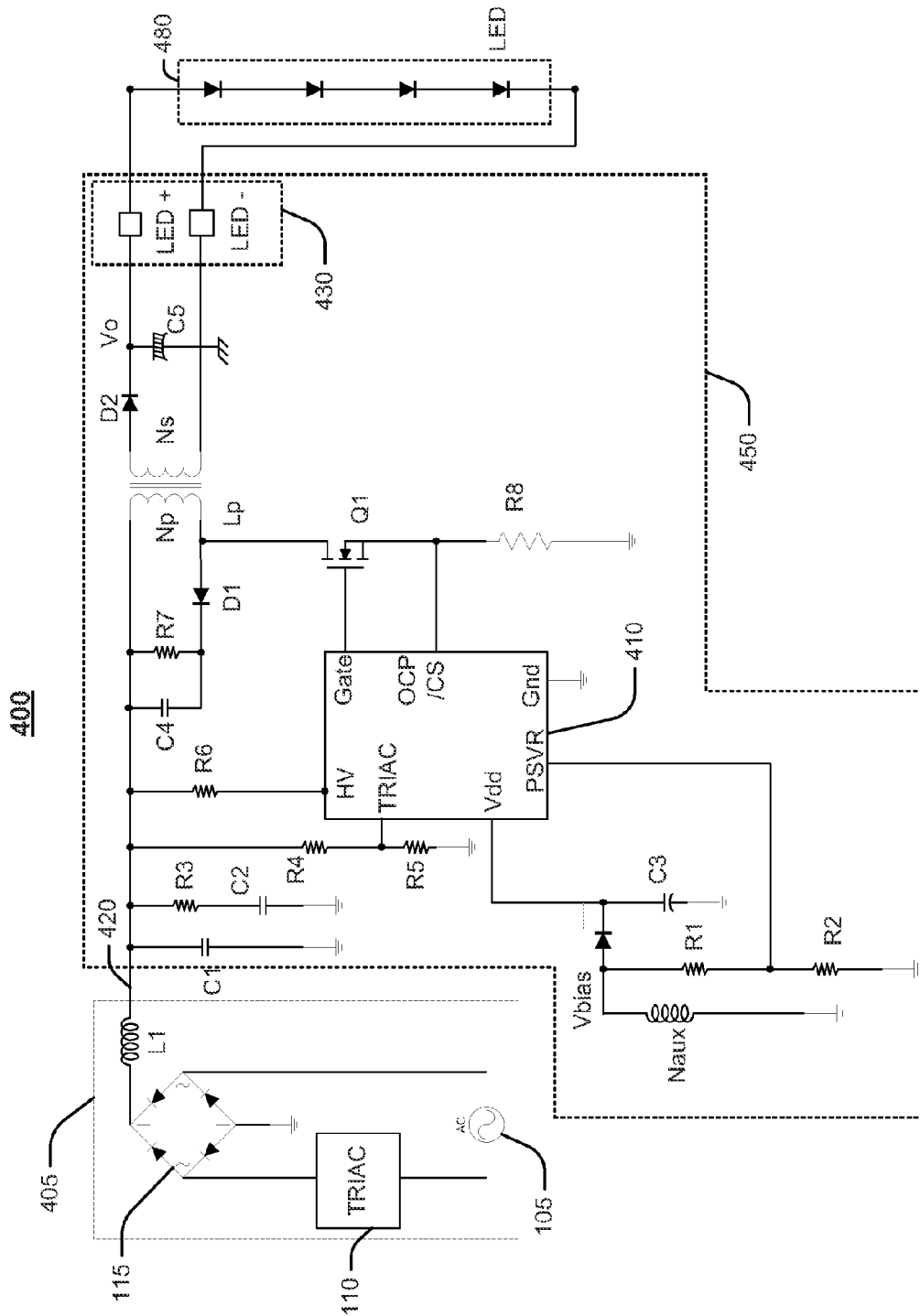
FIG. 4 is a schematic of a TRIAC based dimmer system for controlling LEDs according to various embodiments.

FIG. 4 shows a schematic of circuit 400 according an embodiment of the present disclosure. As shown, the circuit 400 can include a TRIAC dimmer 405. TRIAC dimmer 405 can include a TRIAC 110 coupled to an AC current source 105 and a bridge diode 115. The AC current source can be or be coupled to a standardized power supply. For example, the AC current source can be the current supplied by a local electrical power company, agency or producer. The specifics of the AC current source can therefore vary based on regional differences in the supplied power. In North America, for example, electrical power is typically supplied at approximately 47 Hz to 63 Hz, at 100V to 120V. However, in Europe and Asia, electrical power is typically supplied at approximately 60 HZ at 220V to 240V. In anticipation of providing a universal solution, independent of location and implementation, embodiments of the present invention can function effectively at a variety of frequencies and voltages.

The bridge diode of the TRIAC based dimmer 405 can be biased to ground and coupled to an internal or external inductor L1. As shown, inductor L1 can be coupled to an output 420 of the TRIAC dimmer 405. The output 420 can be coupled to TRIAC dimmable LED driver circuit 450. As shown TRIAC dimmable LED driver circuit 450 can include a controller 410 coupled to the output 420 of the TRIAC dimmer 405 via resistor R4. TRIAC dimmable LED driver circuit 450 can also include an LED socket or connector 430 that can be used to couple the TRIAC dimmable LED driver circuit 450 to LED lamp or light module 480.

Figure 5:
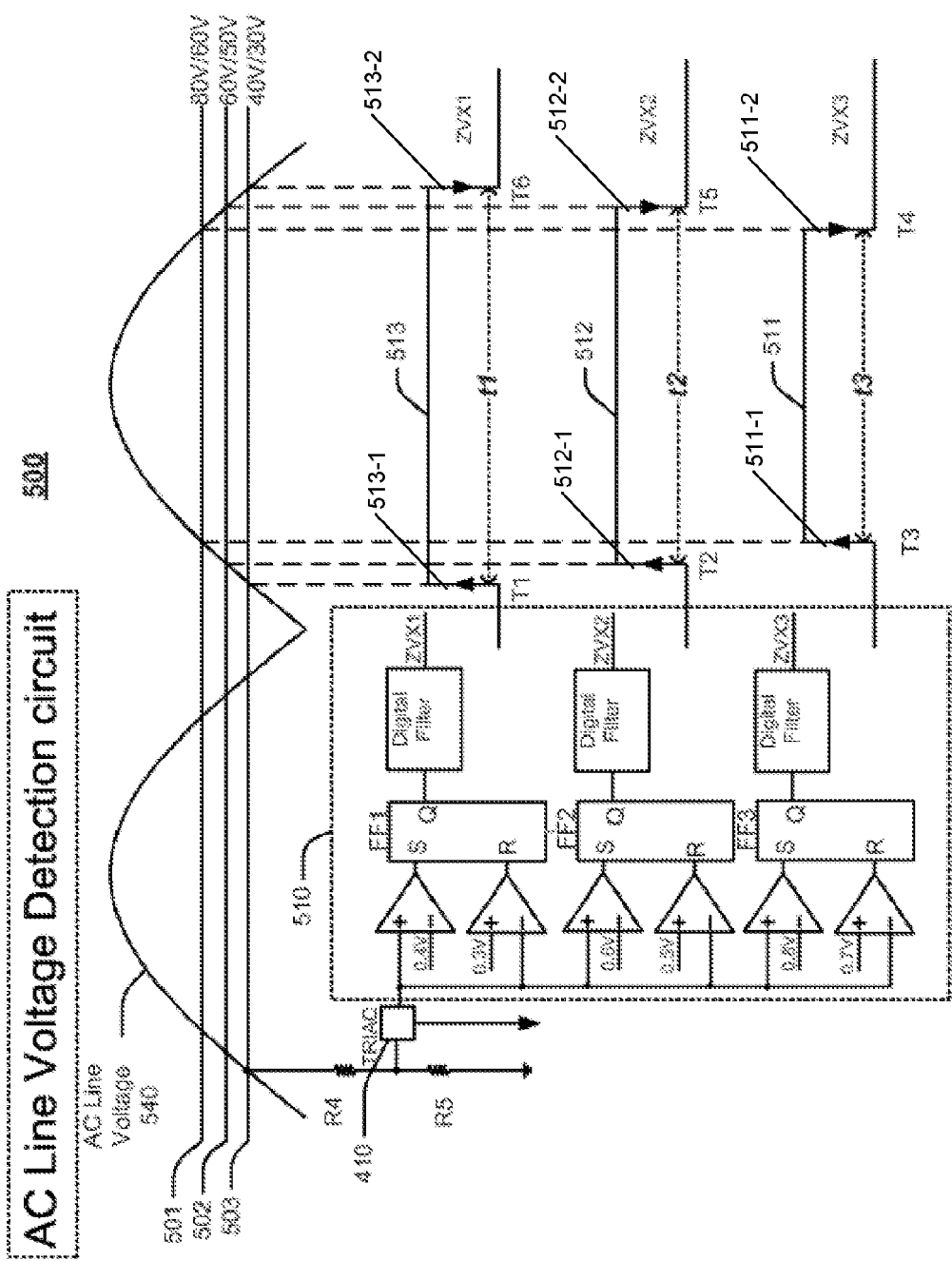
FIG. 5 is a schematic of an AC line voltage detection circuit according to various embodiments.

FIG. 5 illustrates an AC line voltage detection circuit, according to various embodiments. As discussed above, embodiments of the present disclosure can function at various AC current source line frequencies and voltages. The system 500 shown in FIG. 5 shows one embodiment of a circuit 510 that can be used to detect the voltage and frequency of the AC circuit to which the TRIAC dimmable LED driver circuit 450 is connected. When AC line voltage detection circuit 510 is coupled to controller 410, the circuit 510 can detect the frequency and voltage of the AC line. The AC line voltage detection circuit 510 can be described with reference to three modules: ZVX1, ZVX2, and ZVX3. Each section can include a digital filter coupled to the Q lead of a flip-flop circuit. Each flip-flop circuit can have S and R inputs coupled to the output of a comparator. The comparators each can have one input coupled to the AC input line. The other inputs of the comparators can be coupled to fixed voltages as shown in FIG. 5. When coupled to an AC line voltage, ZVX1, ZVX2, and ZVX3 circuits will generate output digital signals with high signal durations of t1, t2, and t3, respectively, when a threshold corresponding to the fixed voltages is reached.

With the voltages applied to the comparators as shown, the output of ZVX1 will have a duration t1=T6−T1, when the AC line voltage 540 reaches threshold 501 80V/60V on the rising and falling edge. For example, the output 513 of ZVX1 will have a first state shown at 513-1 and a second state shown at 513-2. Similarly, the output of AC line voltage detection circuit 510 will be the output of ZVX2 with a high duration of t2=T5−T2, when AC line voltage 540 reaches threshold voltage 502 60V/50V on the rising and falling edge. For example, the output 512 of ZVX2 will have the first state shown at 512-1 and the second state shown at 512-2. The output of ZVX3 will have a high value with a duration t3=T4−T3, when AC line voltage 540 reaches threshold voltage 503 40V/30V on the rising and falling edge of the input signal. For example, the output 511 of ZVX3 will have the first state shown at 511-1 and the second state shown at 511-2. To determine the rising and falling edge of the input AC line voltage 540, the values of t1, t2, and t3, as well as T1, T2, T3, T4, T5, and T6 can be compared. For example, if T1 and T2 happen nearly simultaneously, or at close to the same time within some predetermined time threshold, then it can be determined that T1 is approximately the beginning of the rising edge of the TRIAC output chopped AC line voltage. This data can then be used to determine that the TRIAC dimmable LED driver circuit 450 should reduce the power level sent to the LED lamp 430. Similarly, if the input signal reaches the thresholds on the tailing edge within the predetermined time threshold, the time differences between T6, T5, or T4 will indicate that the input signal is a trailing edge chopped signal. In some embodiments, the predetermined time threshold can be approximately 20 µs. Once it is determined that a TRIAC dimmer is present or being used, then various embodiments of the present invention can be used to determine how to alter the light output level of the LEDs. Altering the light output level of the LEDs can include altering the light level output level in response to the amount the AC current input signal is chopped. The amount that the light level of the LEDs is to be altered can be determined by a dimming ratio.

Figure 6:
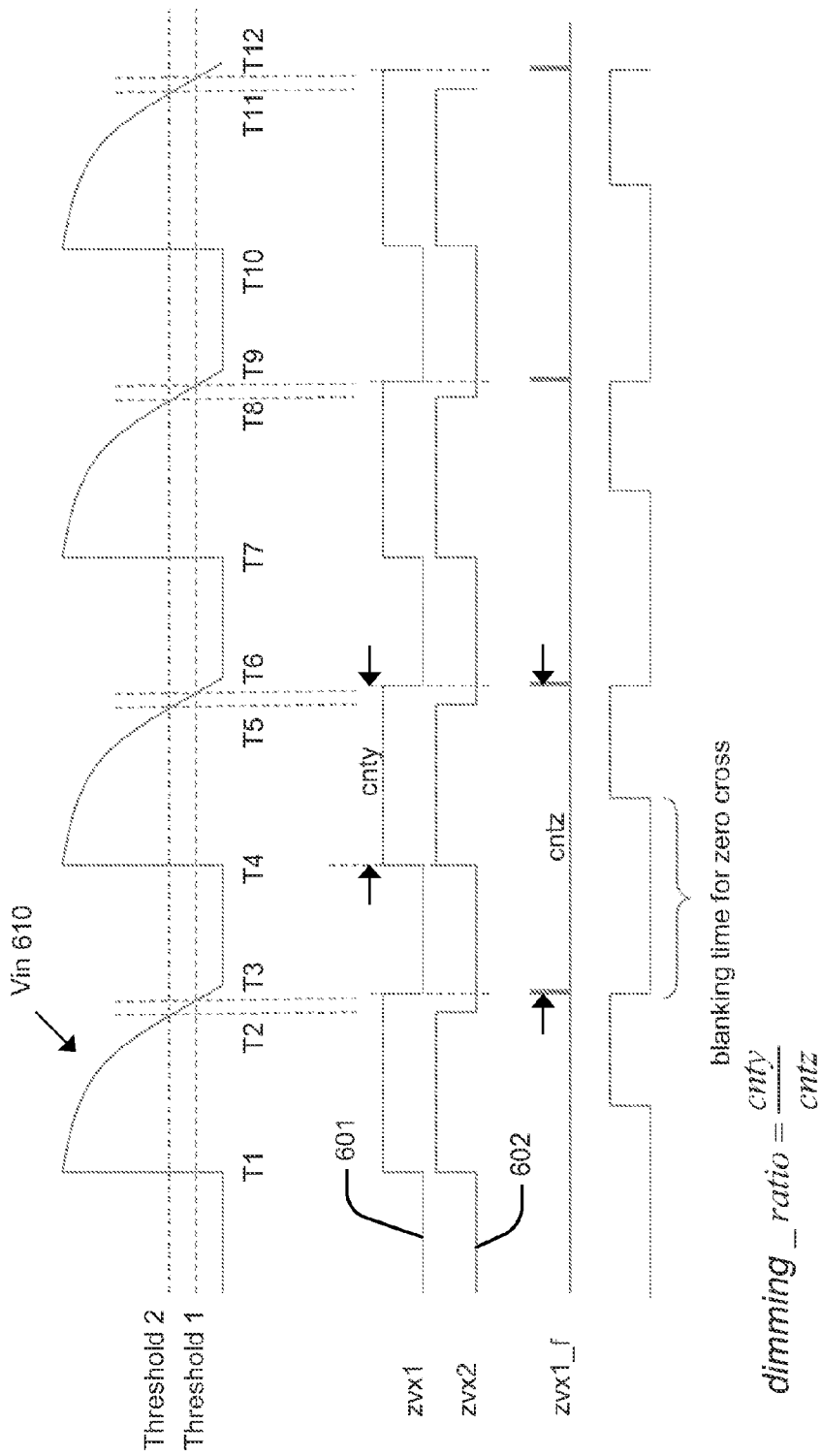
FIG. 6 is an exemplary timing diagram to detect the use or presence of a TRIAC based dimmer according to various embodiments.

FIG. 6 illustrates an example of how the determination of the start and stop times and the duration of the ZVX1 and ZVX2 output signals can be used to determine the dimming ratio according to various embodiments of the present invention. As shown, the $V_{in}$ input AC line voltage from the TRIAC can have a leading edge dimming or chopped profile. In such scenarios, embodiments of the present invention can determine that chopped AC line voltage by looking at ZVX1 output signal 601 and ZVX2 output signal 602.

As shown, $V_{in}$ 601 has leading edge chopping, with a slope so steep at T1, that ZVX1 output signal 601 and ZVX2 output signal 602 both go high at substantially the same time. On the trailing edge, when $V_{in}$ 610, V=threshold 2 at T2, ZVX2 output signal 602 goes low, and when $V_{in}$ 610 reaches V=threshold 1 at T3, ZVX1 output signal 601 goes low. In the next cycle of $V_{in}$ 610, it is determined that the thresholds 1 and 2 are reached on the trailing edge at T6 and T5, respectively. Thus, cnty can be defined at cnty=T6−T4 and cntz=T6−T3, and the dimming ratio can be defined as cnty/cntz.

According to various embodiments, determining the type of TRIAC dimmer being used can be an initial step. As in the example discussed above in reference to FIG. 6, determining whether the TRIAC dimmer is a leading edge or trailing edge dimmer can be based on differences between the times at which various threshold voltages are reached on either the leading or trailing edge. The times can be determined by looking at the digital signals produced by the AC line voltage detection circuit 510, shown in FIG. 5. In such embodiments, if the difference between the times at which ZVX1 601 and ZVX2 602 go high or go low is below some predetermined threshold time, then systems, circuits or methods according to embodiments of the present disclosure, can determine that the a TRIAC dimmer is being used and enter into a TRIAC mode.

For example, if the time between ZVX1 output signal 601 going high and ZVX2 output signal 602 going high is less than 20 µs, then the system can determine that a TRIAC is being used and that circuit 450 should discharge C1 to reduce the impedance on the output of TRIAC dimmer 405.

A TRIAC mode determination means that, according to various embodiments of the present disclosure, the capacitor attached to the controller can be discharged to lower the impedance of the lead of TRIAC dimmable LED driver circuit 450 coupled to the TRIAC dimmer output. Reducing the impedance on the TRIAC dimmer by discharging the capacitor provides a bleeder element for the TRIAC dimmer to avoid the TRIAC dimmer shutting down and causing the light to flicker. Methods and systems for implementing a TRIAC dimmer bleeder are discussed in U.S. patent application Ser. No. 13/023,379, titled "Dimmer Circuit for Electronic Loads," filed on Feb. 8, 2011, and is hereby incorporated by reference in its entirety for all purposes.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A system comprising:
   a first filter configured to
      output a first signal in response to receiving an input signal,
      wherein the first signal has a first state in response to the input signal reaching a first threshold voltage on a leading edge of the input signal, and
      wherein the first signal has a second state in response to the input signal reaching the first threshold voltage on a trailing edge of the input signal;
   a second filter configured to
      output a second signal in response to receiving the input signal, wherein the second signal has the first state in response to the input signal reaching a second threshold voltage on the leading edge of the input signal, and wherein the second signal has the second state in response to the input signal reaching the second threshold voltage on the trailing edge of the input signal; and a detection circuit configured to determine, based on times at which the first threshold and the second threshold are reached on the leading edge of the input signal or the trailing edge of the input signal, whether the input signal is received from a triac.

2. The system of claim 1, wherein the second threshold voltage is greater than the first threshold voltage.

3. The system of claim 2, wherein each of the first filter and the second filter comprises:
a filter circuit;
a flip-flop circuit having an output coupled to an input of the filter circuit;
a first comparator having an output coupled to a first input of the flip-flop circuit; and
a second comparator having an output coupled to a second input of the flip-flop circuit.

4. The system of claim 3, wherein:
the first threshold voltage and the second threshold voltage are determined by a pair of voltages for each of the first filter and the second filter; and
a first voltage of the pair of voltages is applied to an input of the first comparator and a second voltage of the pair of voltages is applied to an input of the second comparator for each of the first filter and the second filter.

5. The system of claim 4, wherein the pair of voltages is different for each of the first filter and the second filter.

6. The system of claim 1, wherein:
the input signal includes an alternating current signal;
the first state of the first signal begins at a first time and ends at a second time; and
the first state of the second signal begins at a third time and ends at a fourth time.

7. The system of claim 6, wherein the first time or the third time occurs within a predetermined time threshold in response to a leading edge of the alternating current signal being chopped by the triac.

8. The system of claim 6, wherein the second time or the fourth time occurs within a predetermined time threshold in response to a trailing edge of the alternating current signal being chopped by the triac.

9. A method comprising:
generating, using a first filter, a first signal having (i) a first state in response to an input signal reaching a first threshold voltage on a leading edge of the input signal, and (ii) a second state in response to the input signal reaching the first threshold voltage on a trailing edge of the input signal;

generating, using a second filter, a second signal having (i) the first state in response to the input signal reaching a second threshold voltage on the leading edge of the input signal, and (ii) the second state in response to the input signal reaching the second threshold voltage on the trailing edge of the input signal; and determining, based on times at which the first threshold and the second threshold are reached on the leading edge of the input signal or the trailing edge of the input signal, whether the input signal is received from a triac.

10. The method of claim 9, further comprising:
determining a first time at which the first state of the first signal begins;
determining a second time at which the first state of the second signal begins;
comparing a difference between the first time and the second time to a threshold; and
determining a type of the input signal based on the comparison.

11. The method of claim 10, wherein determining the type of the input signal comprises determining, in response to the difference between the first time and the second time being less than or equal to the threshold, that the input signal includes an alternating current signal with a leading edge chopped by the triac.

12. The method of claim 9, further comprising:
determining a first time at which the first state of the first signal ends;
determining a second time at which the first state of the second signal ends;
comparing a difference between the first time and the second time to a time threshold; and
determining a type of the input signal based on the comparison.

13. The method of claim 12, wherein determining the type of the input signal comprises determining, in response to the difference between the first time and the second time being less than or equal to the time threshold, that the input signal includes an alternating current signal with a trailing edge chopped by the triac.

* * * * *